United States Patent
Kinyua

(10) Patent No.: US 12,088,313 B2
(45) Date of Patent: Sep. 10, 2024

(54) PIPELINED HYBRID NOISE-SHAPING ANALOG-TO-DIGITAL CONVERTER

(71) Applicant: Taiwan Semiconductor Manufacturing Company, Ltd., Hsinchu (TW)

(72) Inventor: Martin Kinyua, Cedar Park, TX (US)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 129 days.

(21) Appl. No.: 17/847,302

(22) Filed: Jun. 23, 2022

(65) Prior Publication Data

US 2023/0421166 A1    Dec. 28, 2023

(51) Int. Cl.
*H03M 1/06* (2006.01)
*H03M 3/00* (2006.01)

(52) U.S. Cl.
CPC ......... *H03M 1/0626* (2013.01); *H03M 3/414* (2013.01); *H03M 3/426* (2013.01)

(58) Field of Classification Search
CPC ..... H03M 1/0626; H03M 3/426; H03M 3/414
See application file for complete search history.

(56) References Cited

U.S. PATENT DOCUMENTS

| | | | |
|---|---|---|---|
| 4,862,169 A * | 8/1989 | van Bavel | H03M 3/418 375/252 |
| 5,153,593 A | 10/1992 | Walden et al. | |
| 6,795,002 B2 | 9/2004 | Gupta | |
| 6,914,549 B2 * | 7/2005 | Chen | H03M 1/005 341/143 |
| 9,231,614 B2 * | 1/2016 | Silva | H03M 3/352 |
| 2008/0150776 A1 | 6/2008 | DiGiandomenico et al. | |
| 2009/0128384 A1 | 5/2009 | Di Giandomenico et al. | |
| 2019/0222223 A1 | 7/2019 | Srinivasan et al. | |

OTHER PUBLICATIONS

Taiwan Office Action; Application No. 112100982; Dated Nov. 15, 2023.

* cited by examiner

*Primary Examiner* — Khai M Nguyen
(74) *Attorney, Agent, or Firm* — Jones Day

(57) ABSTRACT

Systems and methods are provided for implementing an analog-to-digital converter. In some embodiments, the analog-to-digital converter comprises a first-stage quantizer, a second-stage quantizer, and a noise cancellation filter. The first-stage quantizer is configured to receive an analog input signal and generate a first-stage digital output signal based on the analog input signal and a residual signal based on the first-stage digital output signal and the analog input signal. The second-stage quantizer is configured to receive the residual signal, to determine a first-stage quantization error based on the residual signal, to digitize the first-stage quantization error, and to generate a second-stage digital output signal based on the first-stage quantization error. The noise cancellation filter is configured to receive the first-stage digital output signal and the second-stage digital output signal and to generate a noise-cancellation output signal comprising a quantization error component less that the first-stage quantization error.

20 Claims, 13 Drawing Sheets

PIPELINED HYBRID NOISE-SHAPING ANALOG-TO-DIGITAL CONVERTER

TECHNICAL FIELD

The present disclosure relates to analog-to-digital converters.

BACKGROUND

Analog-to-digital converters are electronic devices used to convert analog signals into digital signals. Previously known systems and methods implemented in analog-to-digital converters achieve signal-to-noise ratios (SNRs) and conversion bandwidths that require improvement. These systems and methods may also consume much power, in part because they require high-gain operational amplifiers. These systems and methods are not readily implementable in deeply-scaled nanoscale process technologies, in part because the reduced power supply voltage in these nanoscale process technologies makes it challenging to implement high-gain operational amplifiers. Therefore, there is a need in the art for systems and methods that can be readily implemented in low-power supply environments.

BRIEF DESCRIPTION OF THE DRAWINGS

The following detailed description will be better understood when read in conjunction with the appended drawings. For the purpose of illustration, there is shown in the drawings certain embodiments of the present disclosure. It should be understood, however, that the invention is not limited to the precise arrangements and instrumentalities shown. The accompanying drawings, which are incorporated in and constitute a part of this specification, illustrate an implementation of systems and apparatuses consistent with the present invention and, together with the description, serve to explain advantages and principles consistent with the invention.

DETAILED DESCRIPTION

Figure 1:
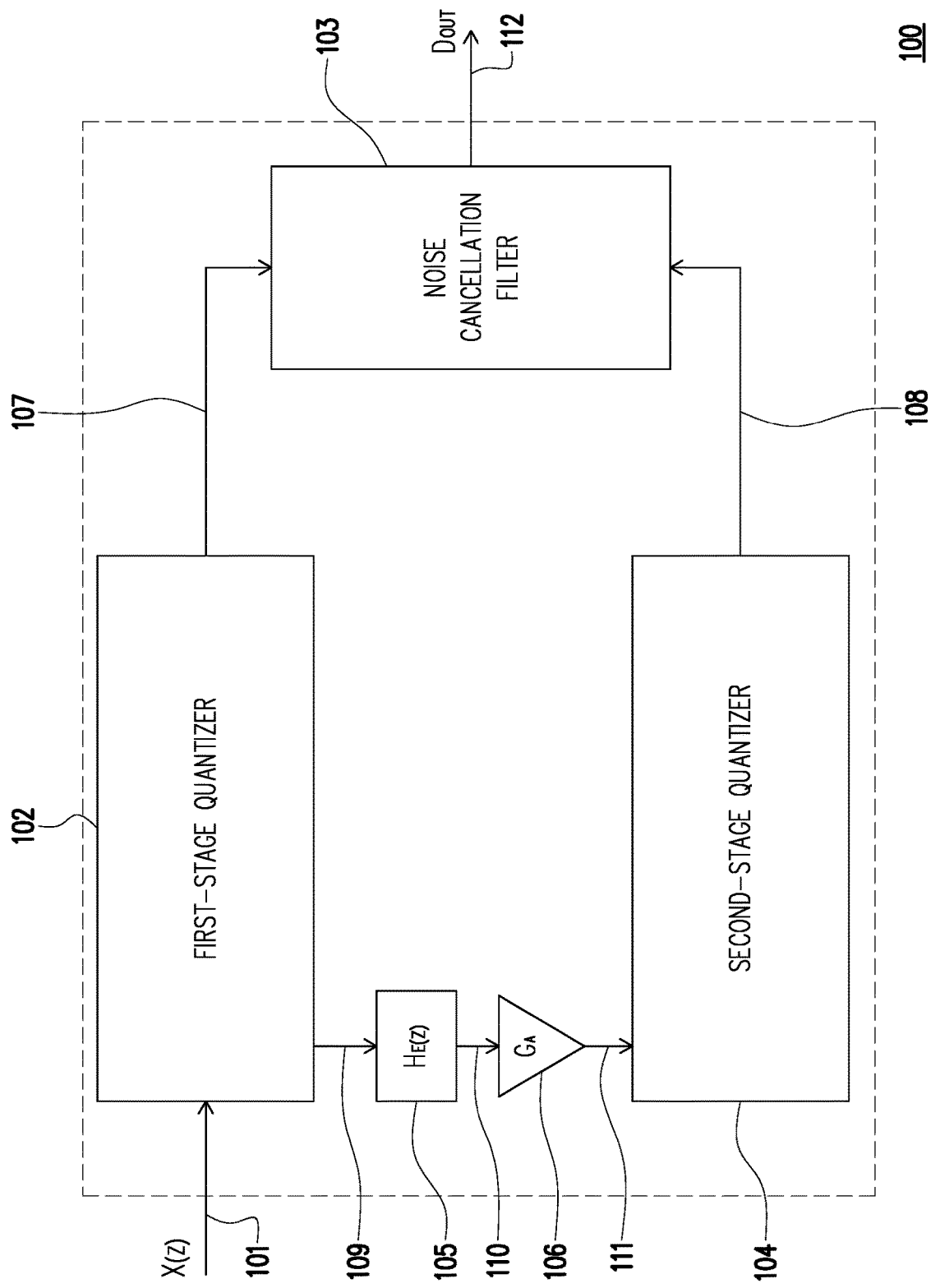
FIG. 1 is a block diagram of a pipelined noise-shaping analog-to-digital converter, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in some various examples. This repetition is for the purpose of simplicity and clarity and does not in itself dictate a relationship between some various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some embodiments of the disclosure are described. Additional operations can be provided before, during, and/or after the stages described in these embodiments. Some of the stages that are described can be replaced or eliminated for different embodiments. Additional features can be added to the circuit. Some of the features described below can be replaced or eliminated for different embodiments. Although some embodiments are discussed with operations performed in a particular order, these operations may be performed in another logical order.

Analog-to-digital converters are designed to receive an analog signal and to generate a digital representation of that analog signal. Conventional analog-to-digital converters employ power-consuming high-gain operational amplifiers that result in high signal-to-noise ratios (SNRs) and low conversion bandwidths. Approaches of the present disclosure eliminate or mitigate the problems associated with conventional approaches. In some embodiments, the analog-to-digital converter comprises a first-stage quantizer, a second-stage quantizer, and a noise cancellation filter that allows the analog-to-digital converter of the present disclosure to be implemented in low supply voltage environments. In some embodiments, "low supply voltage" refers to the core supply rated voltage used in advanced digital processes (e.g., between 0.75V and 0.96V for 5 nm to 3 nm technologies). An advantage of implementation in a low supply voltage environment is that as the technology is scaled, transistor speed increases which leads to higher conversion bandwidth. In contrast, implementation at higher supply voltages (e.g., 1.8V) increases power consumption and reduces conversion bandwidth. Combining two separate stages in an analog-to-digital converter has the advantage of obtaining higher-order noise shaping.

FIG. 1 is a block diagram of a pipelined noise-shaping analog-to-digital converter ("analog-to-digital converter") 100, in accordance with some embodiments. In the example shown in FIG. 1, the analog-to-digital converter 100 includes a first-stage quantizer 102, a passive error extraction filter 105, a quantization error amplifier 106, a second-stage quantizer 104, and a noise cancellation filter 103. In one example embodiment, the analog-to-digital converter employs successive approximation registers (SARs). As understood by one of ordinary skill in the art, SARs are a class of analog-to-digital converters that in some embodiments implements a binary search algorithm.

The analog-to-digital converter of the present disclosure may employ a "pipelined" architecture. The pipelined architecture allows serial operations to be performed more quickly. In the context of an analog-to-digital converter, each component (e.g., stage) carries out an operation on an input signal and then provides an output signal for the following stage or module that may be based in part on that input signal. Once the following stage or module has acquired the output signal of that component, the component can acquire another input signal and subsequently perform the same or a similar operation on that signal. Thus, in a pipeline operation several different components and stages are processing different signals concurrently and the throughput rate is limited only by the processing speed of each component and on the acquisition time of the next component.

In the example embodiment shown in FIG. 1, an analog input signal 101 is received by the first-stage quantizer 102. The first-stage quantizer 102 then generates a residual signal 109 that is generated from combining the analog input signal 101 with an analog form of a first-stage digital output signal 107, as discussed below further with respect to FIG. 2. The residual signal 109 is then received at the passive error extraction filter 105, which is used to extract a first-stage quantization error and generate a first-stage quantization error 110. In some example embodiments, this first-stage quantization error 110 is inverted prior to being received at the quantization error amplifier 106.

The quantization error amplifier 106 then applies a signal transfer function to the first-stage quantization error 110 to generate a second-stage input signal 111. In the example embodiment of FIG. 1, this signal transfer function is a constant, $G_A$. Those of ordinary skill in the art will appreciate that other signal transfer functions that are within the spirit and scope of the present disclosure could be employed by the quantization error amplifier 106 in other example embodiments. The first-stage quantizer 102 also generates a first-stage digital output signal 107 that is based on the analog input signal 101 and a first-stage quantization error.

The second-stage quantizer 104 receives the second-stage input signal 111. In one example embodiment, the architecture of the second-stage quantizer 104 is the same or substantially the same as the first-stage quantizer 102. However, the second-stage quantizer 104 may differ from the first-stage quantizer 102 while still being within the spirit and scope of the present disclosure. The second-stage quantizer 104 then digitizes the first-stage quantization error, determines a second-stage quantization error, and generates a second-stage digital output signal 108 that is based on the second-stage input signal 111 and the second-stage quantization error.

Also shown in FIG. 1 is a noise cancellation filter 103. The noise cancellation filter is coupled to both the first-stage quantizer 102 and the second-stage quantizer 104. In embodiments of the present disclosure, the noise cancellation filter 103 receives both the first-stage digital output signal 107 and the second-stage digital output signal 108. The noise cancellation filter 103 then generates a noise cancellation output signal 112 that has a quantization error component that is less than the first-stage quantization error 110. In some example embodiments, the first-stage quantization error may be totally or nearly eliminated from the quantization error component of the noise-cancellation output signal 112. The quantization error signal component of the noise cancellation output signal 112 may also be less than the second-stage quantization error.

Figure 2:
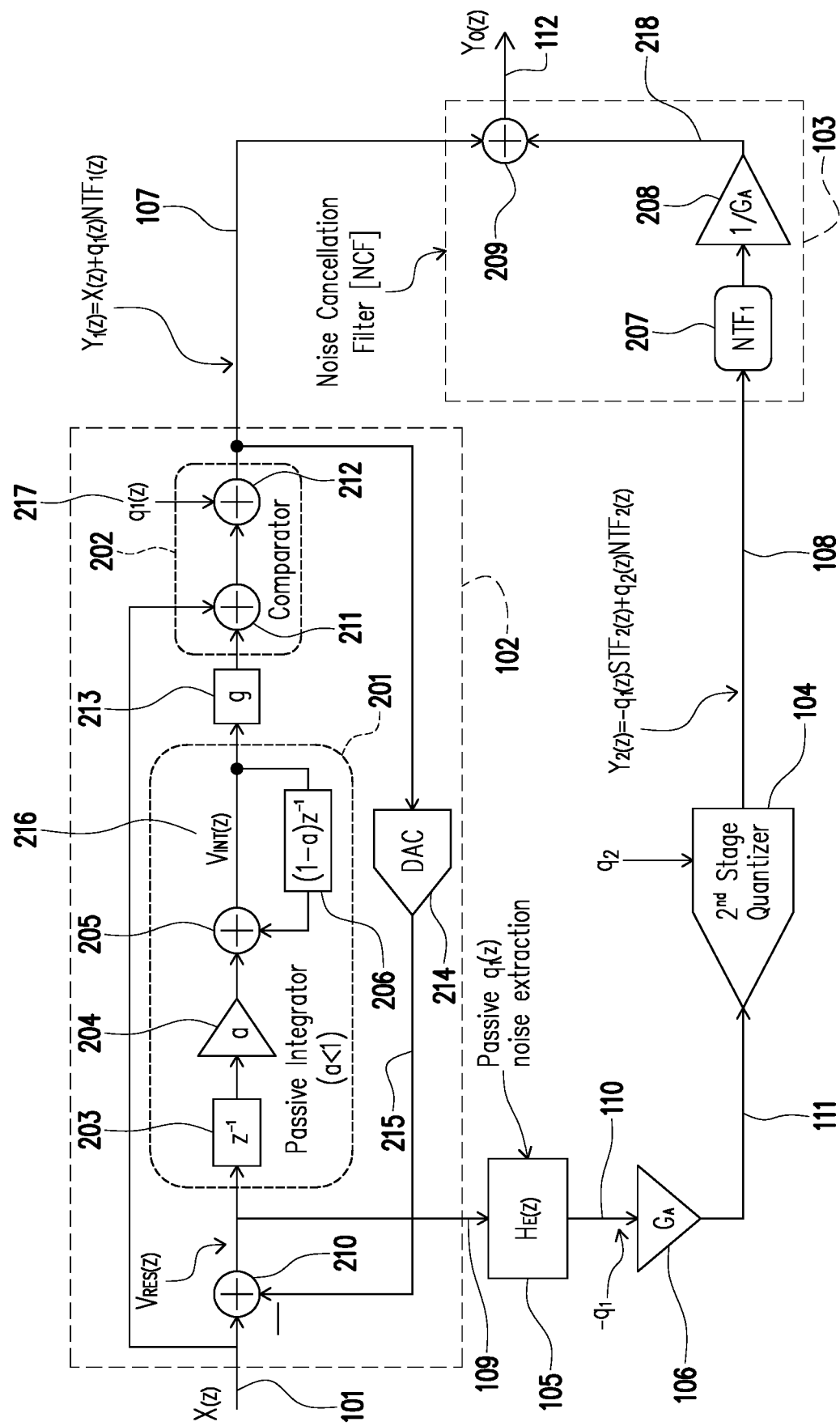
FIG. 2 is a diagram of the analog-to-digital converter with a detailed implementation of the first-stage quantizer, in accordance with some embodiments.

FIG. 2 is a diagram of the analog-to-digital converter, showing a detailed implementation of the first-stage quantizer 102, in accordance with some embodiments. The first-stage quantizer includes a first adder 210, a passive integrator 201, a quantization error gain factor 213, a comparator 202, and a digital-to-analog converter 214. The first adder 210 receives the analog input signal 101, along with the analog form 215 of the first-stage digital output signal 107. The adder 210 combines these two signals (215, 101) to generate the residual signal VRES(z) 109. The residual signal 109 is then received by the passive integrator 201. The passive integrator 201 includes a clock period delay component 203, a passive integrator gain factor 204, a second adder 205, and a passive integrator transfer function 206. In the example of FIG. 2, the passive integrator transfer function Hint(z) is given by equation 1:

$$H_{int}(z) = \frac{a * z^{-1}}{1 - (1-a)z^{-1}} \quad (1)$$

As illustrated by equation 1, the numerator of the passive integrator passive transfer function $H_{int}(z)$ is equal to the passive integrator gain factor 'a' 204 multiplied by the clock period delay component $z^{-1}$ 203. As also illustrated by equation 1, the denominator of the passive integrator passive transfer function $H_{int}(z)$ is obtained by subtracting the passive integrator gain factor 'a' 204 from 1 and multiplying this quantity by the clock period delay component 203. The result is then subtracted from 1.

As shown in FIG. 2, the clock period delay component 203 and the passive integrator gain factor are applied to the residual signal 109 serially before being received at the second adder 205. The second adder 205 also receives a signal resulting from the passive integrator transfer function 206 to generate a passive integration output signal $V_{INT}(z)$ 216. A quantization error gain factor 'g' 213 is then applied to the passive integration output signal 216. In other embodiments of the present disclosure, the quantization error gain factor is implemented within the first-stage quantizer 102 prior to the passive integrator 201. The resulting signal is then received by a third adder 211 of the comparator 202. The comparator includes a third adder 211 and a fourth adder 212. The third adder 211 also receives the analog input signal 101. The output of the third adder 211 is then received at the fourth adder 212 along with a first-stage quantization error 217. The output of the fourth adder 212 is the first-stage digital output signal 107. In the example embodiment of FIG. 2, the first stage output signal $Y_1(z)$ is given by equation 2:

$$Y_1(z)=X(z)+q_1(z)*NTF_1(z) \quad (2)$$

In equation 2, X(z) is the analog input signal 101, $q_1(z)$ is the first-stage quantization error 217, and $NTF_1$ is a noise transfer function of the first stage, shown by equation 3 below:

$$NTF_1 = \frac{g}{1+H_{int}} \quad (3)$$

Combining equations 1, 2, and 3 via substitution yields a representation of the first-stage digital output signal $Y_1(z)$ 107 in terms of the passive integrator gain factor, a 204, the quantization error gain factor, 'g' 213, the first-stage quantization error $q_1(z)$ 217, and the analog input signal X(z) 101. This is shown by equation 4:

$$Y_1(z) = X(z) + \frac{1-(1-a)z^{-1}}{1-[(1-a)-ag]z^{-1}}[q_1(z)+V_{n,CMP}(z)] \quad (4)$$

In one example embodiment, the passive integrator gain factor 'a' 204 is equal to 0.2, and the quantization error gain factor 'g' 213 is equal to 4. In such a case, the first-stage digital output signal $Y_1(z)$ 107 is given by equation 5:

$$Y_1(z)=X_1(z)(1-0.8z^{-1})[q_1(z)+V_{n,CMP}(z)] \quad (5)$$

FIG. 2 also shows a detailed implementation of the noise cancellation filter 103, in accordance with some embodiments. In the example shown in FIG. 2, the noise cancellation filter 103 includes a noise-cancellation noise transfer function 207, a noise cancellation amplifier 208, and a fifth adder 209. In one example embodiment, the noise cancellation noise transfer function 207 is the same function as the first-stage noise transfer function. However, the noise cancellation noise transfer function 207 and the first-stage noise transfer function may differ in example embodiments that are within the spirit and scope of the present disclosure. The noise cancellation noise transfer function 207 is applied to the second-stage digital output signal 108. The output of the noise cancellation noise transfer function 207 is then received at the noise cancellation amplifier 208. In the example shown in FIG. 2, the gain of the noise cancellation amplifier 208 is the inverse of the gain of the quantization error amplifier 106. This noise cancellation amplifier 208 generates a noise cancellation amplifier output signal 218 and can be used to reduce a quantization error component of the noise cancellation output signal 112. The fifth adder 209 of the noise cancellation filter 103 is used to combine the first-stage digital output signal 107 and the noise cancellation amplifier output signal 218 to generate the noise cancellation output signal $Y_0(z)$ 112. The noise cancellation output signal $Y_0(z)$ can be represented by equation 6:

$$Y_0(z) = X(z) + \frac{q_2 * NTF_2 * NTF_1}{G_A} \quad (6)$$

As shown in equation 6, the first-stage quantization error 217 is absent from the noise cancellation output signal 112. In some embodiments of the present disclosure, the first-stage quantization error 217 may not be completely absent from the noise cancellation output signal 112 but may be reduced.

Figure 3:
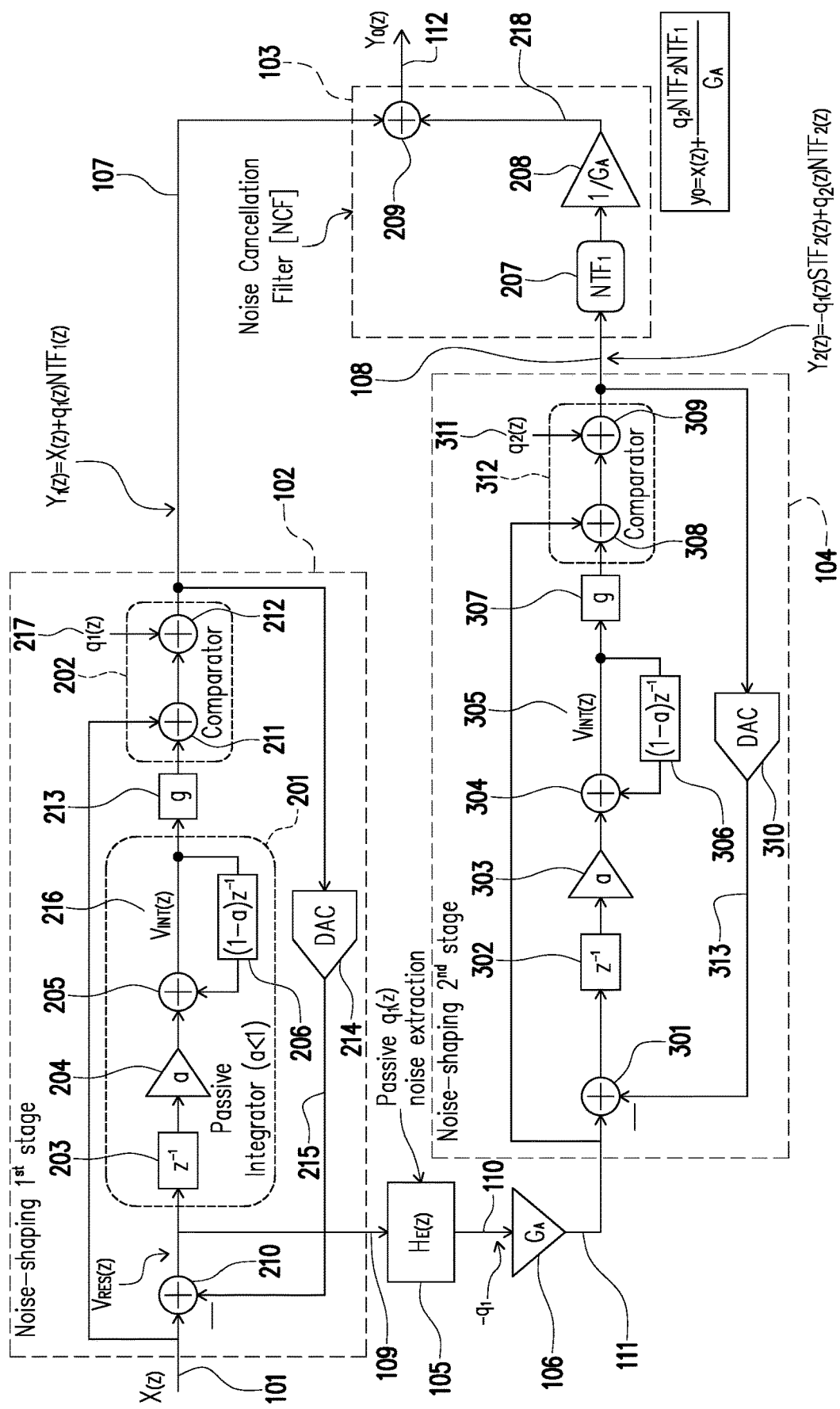
FIG. 3 is a diagram of an analog-to-digital converter with a detailed implementation of the second-stage quantizer 104, in accordance with some embodiments.

FIG. 3 is a diagram of an analog-to-digital converter 100 with a detailed implementation of the second-stage quantizer 104, in accordance with some embodiments. As discussed above, the architecture of the second-stage quantizer 104 may be the same or substantially the same as the first-stage quantizer 102. In the example shown in FIG. 3, the second-stage quantizer 104 includes a first adder 301, a clock period delay component 302, a passive integrator gain factor 303, a second adder 304, a quantization error gain factor 307, a second-stage passive integrator transfer function 306, a comparator 312, and a digital-to-analog converter 310. The first adder 301 receives the second-stage input signal 111, along with an analog form 313 of the second-stage digital output signal 108. Because the second-stage input signal 111 is typically small and mostly random in nature, the impact of analog circuit non-idealities is mitigated, which reduces undesirable harmonic distortion. The first adder 301 combines these two signals (313, 111). The output of the first adder 301 is then received by the clock period delay component 302. Then, a passive integrator gain factor 303 is applied to the output of the clock period delay component 302 before being received at the second adder 304. The second adder 304 also receives a feedback signal from a second-stage passive integrator transfer function 306, which is used to generate a second-stage passive integration output signal VINT(z) 305. In the example of FIG. 3, the passive integrator transfer function Hint(z) is given by equation 1 above.

As shown in FIG. 3, a quantization error gain factor 307 is then applied to the second-stage passive integration output signal 305. The resulting signal is then received by a third adder 308 of the comparator 312. The comparator includes a third adder 308 and a fourth adder 309. The third adder 308 also receives the second-stage input signal 111. The output of the third adder 308 is then received at the fourth adder 309 along with a second-stage quantization error 311. The output of the fourth adder 309 is the second-stage digital output signal 108. In the example embodiment of FIG. 3, the second-stage digital output signal $Y_2(z)$ is given by equation 7:

$$Y_2(z)=-q_1(z)*STF_2(z)+q_2(z)*NTF_2(z) \quad (7)$$

In equation 7, $-q_1(z)*STF_2(z)$ represents the second-stage input signal. $q_1(z)$ is the first-stage quantization error 217, and $STF_2$ is a signal transfer function that is applied with the quantization error amplifier 106. In the example embodiment of FIG. 3, the signal transfer function $STF_2$ is interstage gain $G_A$. $q_2(z)$ represents the second-stage quantization error and $NTF_2$ represents a second-stage noise transfer function. In some embodiments of the present disclosure, the second-stage noise transfer function is the same function as the first-stage noise transfer function. In one example, the first-stage noise transfer function and the second-stage noise transfer function are given by equations 8 and 9, respectively:

$$NTF_1(z)=(1-0.8z^{-1}) \quad (8)$$

$$NTF_2(z)=(1-0.8z^{-1}) \quad (9)$$

In the example embodiment demonstrated by equations 8 and 9, the noise transfer functions of the first and second stages are the same functions. When equations 8 and 9 are applied to the example shown in FIG. 3, the noise transfer output signal $Y_0(z)$ is obtained by substituting equations 8 and 9 into equation 6 to obtain equation 10:

$$Y_0(z) = X(z) + \frac{q_2 * (1 - 0.8z^{-1})^2}{G_A} \quad (10)$$

As discussed above, the first-stage quantization error 217 is absent from the noise transfer output signal.

Figure 4A:
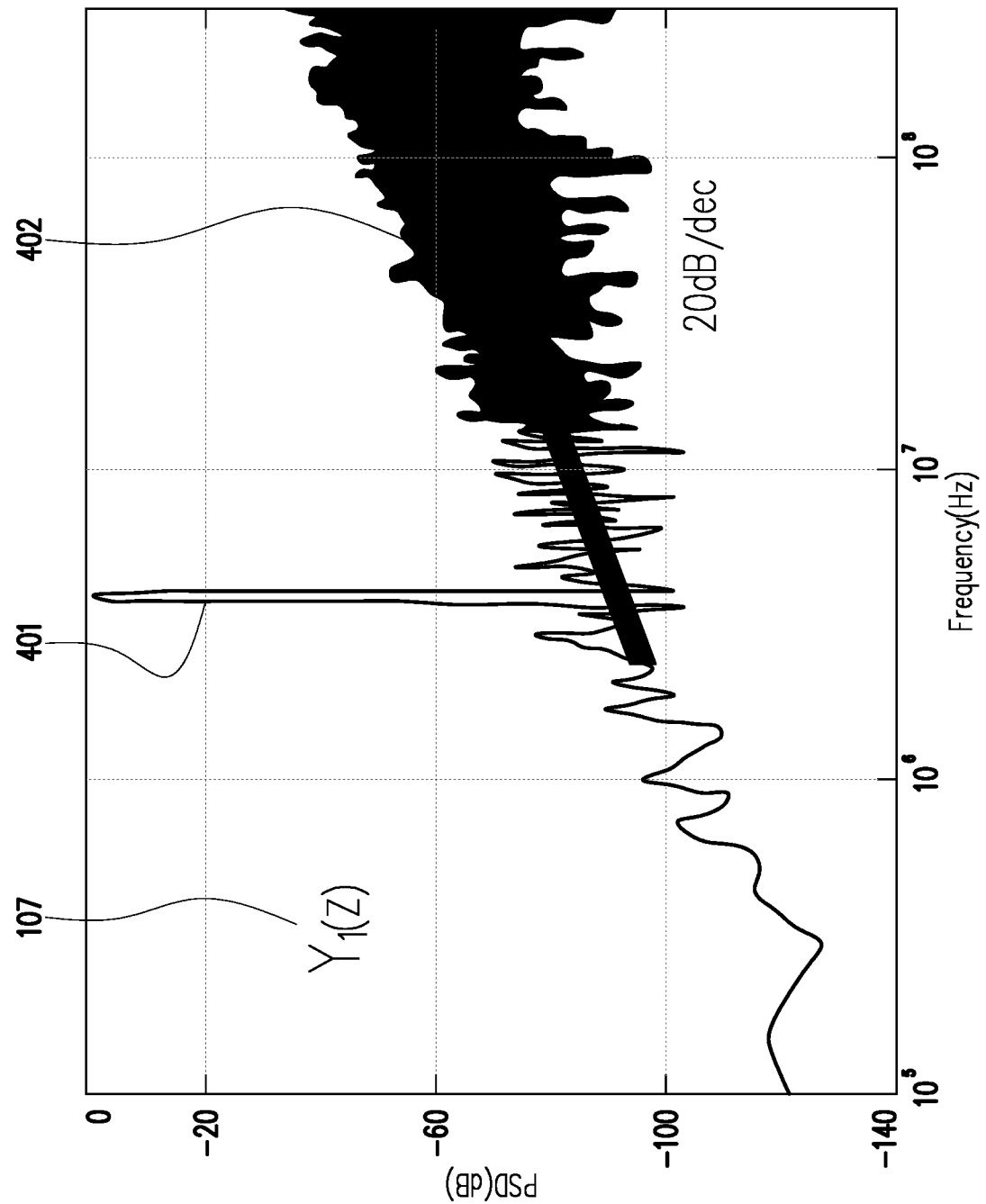
FIG. 4a depicts an example first-stage digital output signal represented in the frequency domain, in accordance with some embodiments.

FIG. 4a depicts an example first-stage digital output signal $Y_1(z)$ 107 represented in the frequency domain, in accordance with some embodiments. As shown in FIG. 4a, the magnitude of the noise associated with various frequencies of the first-stage digital output signal 107 is substantial. The "signal" portion 401 of the first-stage digital output signal 107 resulting from the analog input signal $X(z)$ 101 is shown by the spike in the graph of FIG. 4a. Those of ordinary skill in the art will appreciate that the particular frequencies and magnitudes shown in FIG. 4a are merely example parameters and that various electronic components could be employed that result in first-stage digital output signals of differing frequencies and magnitudes, while still being within the spirit and scope of the present disclosure.

Figure 4B:
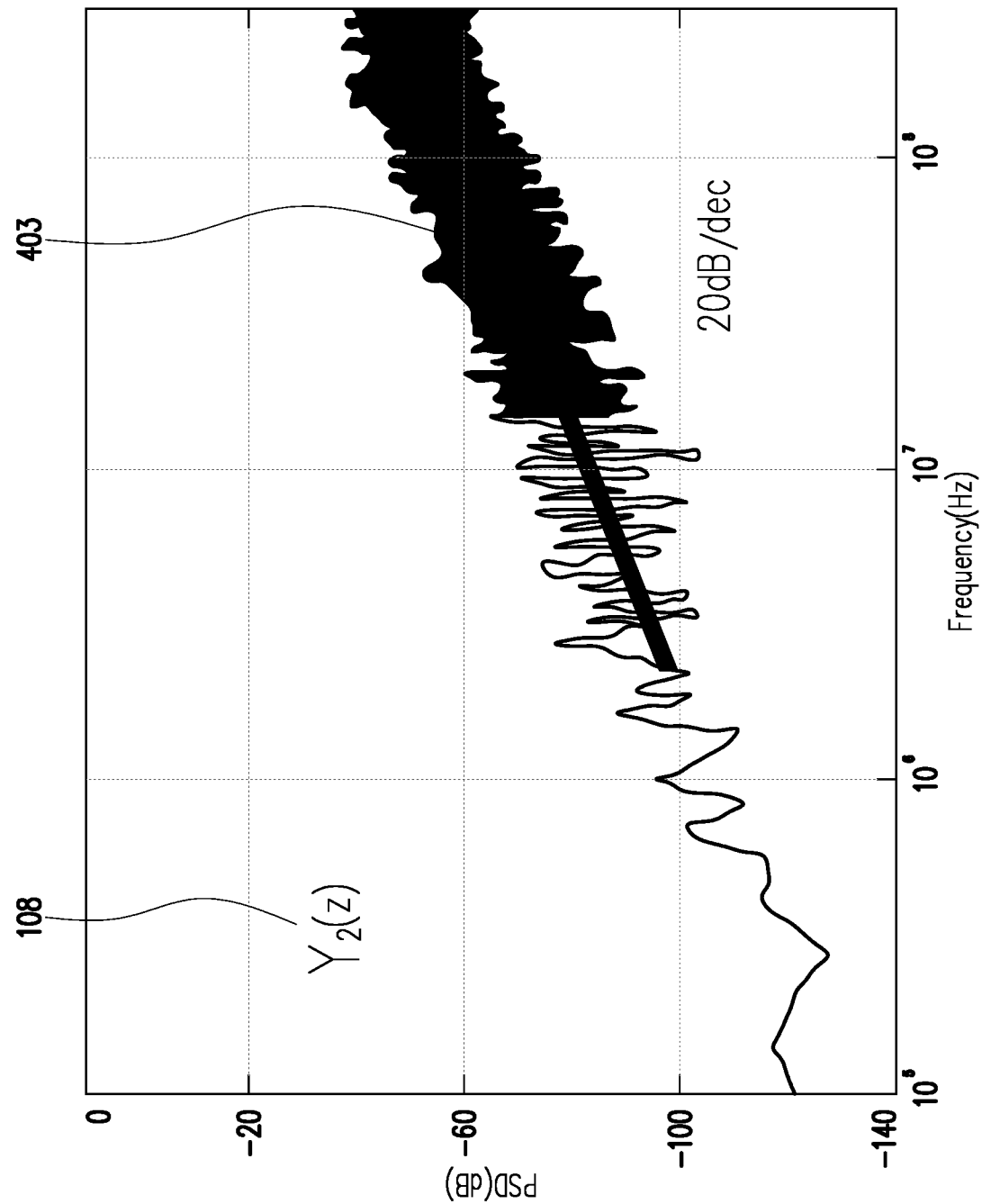
FIG. 4b depicts an example second-stage digital output signal represented in the frequency domain, in accordance with some embodiments.

FIG. 4b depicts an example second-stage digital output signal $Y_2(z)$ 108 represented in the frequency domain, in accordance with some embodiments. As shown in FIG. 4b, there is not a component of the second-stage digital output signal 108 that results from the analog input signal 101. This is further demonstrated by the lack of an analog input signal component in equation 6. As described above, the second-stage digital output signal 108 comprises a first component that is based on the inverted first-stage quantization error signal 110 and a second component that is based on the second-stage quantization error 311. Those of ordinary skill in the art will appreciate that the particular frequencies and magnitudes shown in FIG. 4b are merely example parameters and that various electronic components could be employed that result in second-stage digital output signals of differing frequencies and magnitudes, while still being within the spirit and scope of the present disclosure.

Figure 4C:
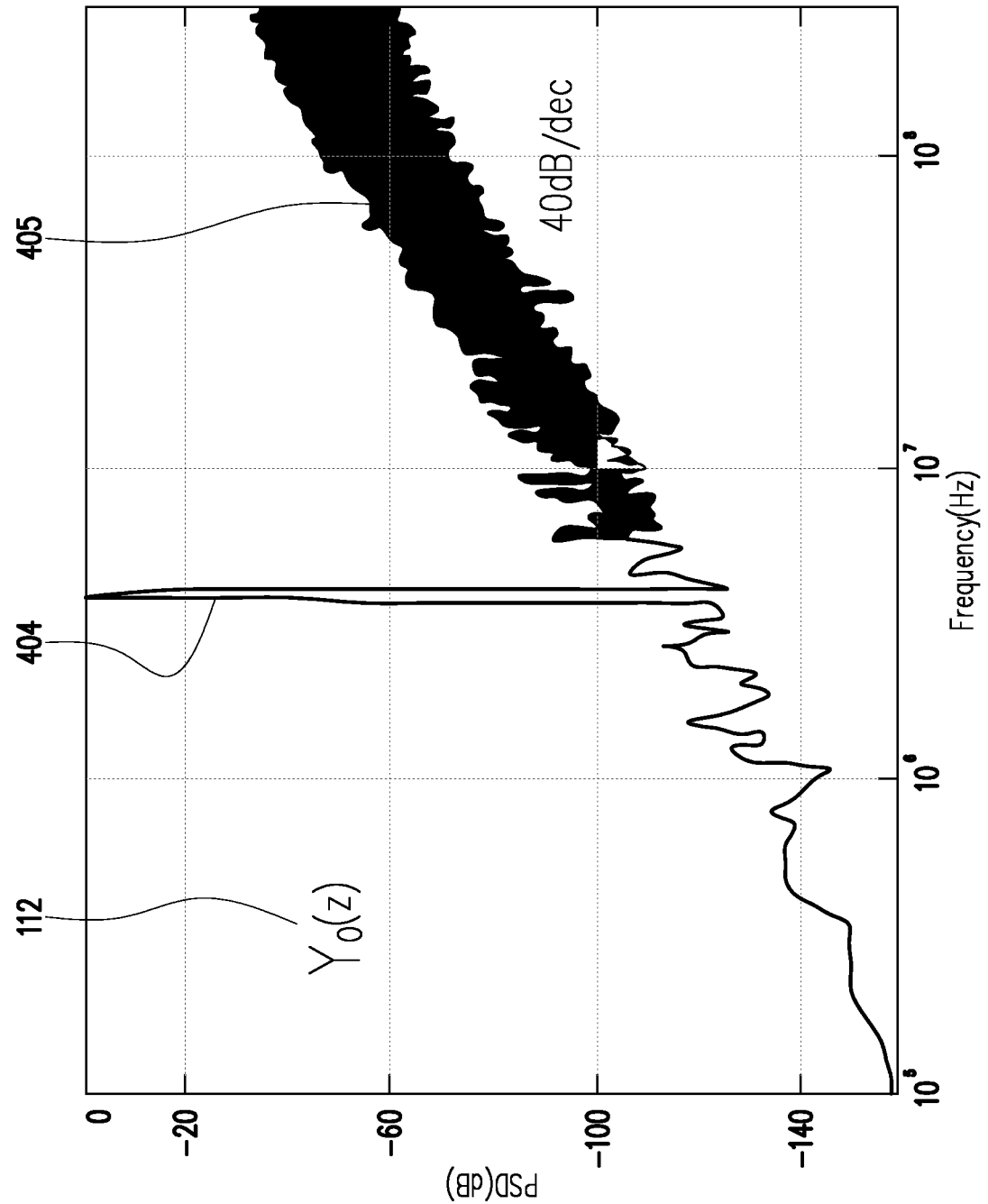
FIG. 4c depicts an example noise cancellation output signal represented in the frequency domain, in accordance with some embodiments.

FIG. 4c depicts an example noise cancellation output signal 112 represented in the frequency domain, in accordance with some embodiments. The noise associated with the frequencies of FIG. 4c is less than the noise present in the first-stage digital output signal 107 and the second-stage digital output signal 108, as shown by FIGS. 4a and 4b. Furthermore, FIG. 4c illustrates that the noise at frequencies close to the frequencies of the signal component associated with the analog input signal 401 is substantially diminished in the noise cancellation output signal 112 as compared with the first-stage digital output signal 107. Those of ordinary skill in the art will appreciate that the particular frequencies and magnitudes shown in FIG. 4c are merely example parameters and that various electronic components could be employed that result in noise cancellation output signals of differing frequencies and magnitudes, while still being within the spirit and scope of the present disclosure.

Figure 5:
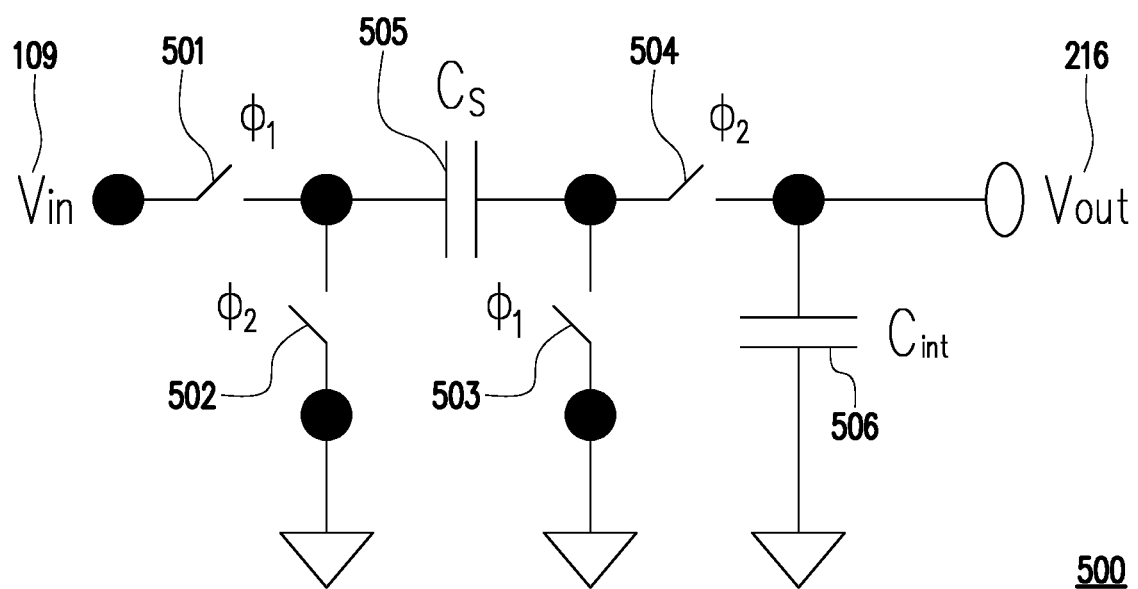
FIG. 5 shows a passive switched-capacitor integrator, in accordance with some embodiments.

FIG. 5 shows a passive switched-capacitor integrator 500, in accordance with some embodiments. The passive switched-capacitor integrator 500 is an example embodiment of the passive integrator 201 and operates similarly to the passive integrator 201 as described in the discussion of FIG. 2. The passive switched capacitor integrator 500 includes a first switch 501, a second switch 502, a third switch 503, and a fourth switch 504. The integrator 500 also includes a first capacitor 505 and a second capacitor 506. In the example shown in FIG. 5, the passive integrator gain factor 'a' 204 is given by equation 11:

$$a = \frac{C_S}{C_{int} + C_S} \quad (11)$$

In equation 10, 'a' is the passive integrator gain factor 204, $C_S$ is the capacitance value of the first capacitor 505, and $C_{int}$ is the capacitance value of the second capacitor 506. In example embodiments of the present disclosure, the passive error extraction filter 105 contains an architecture that is similar or the same as the passive switched-capacitor integrator 500.

Figure 6:
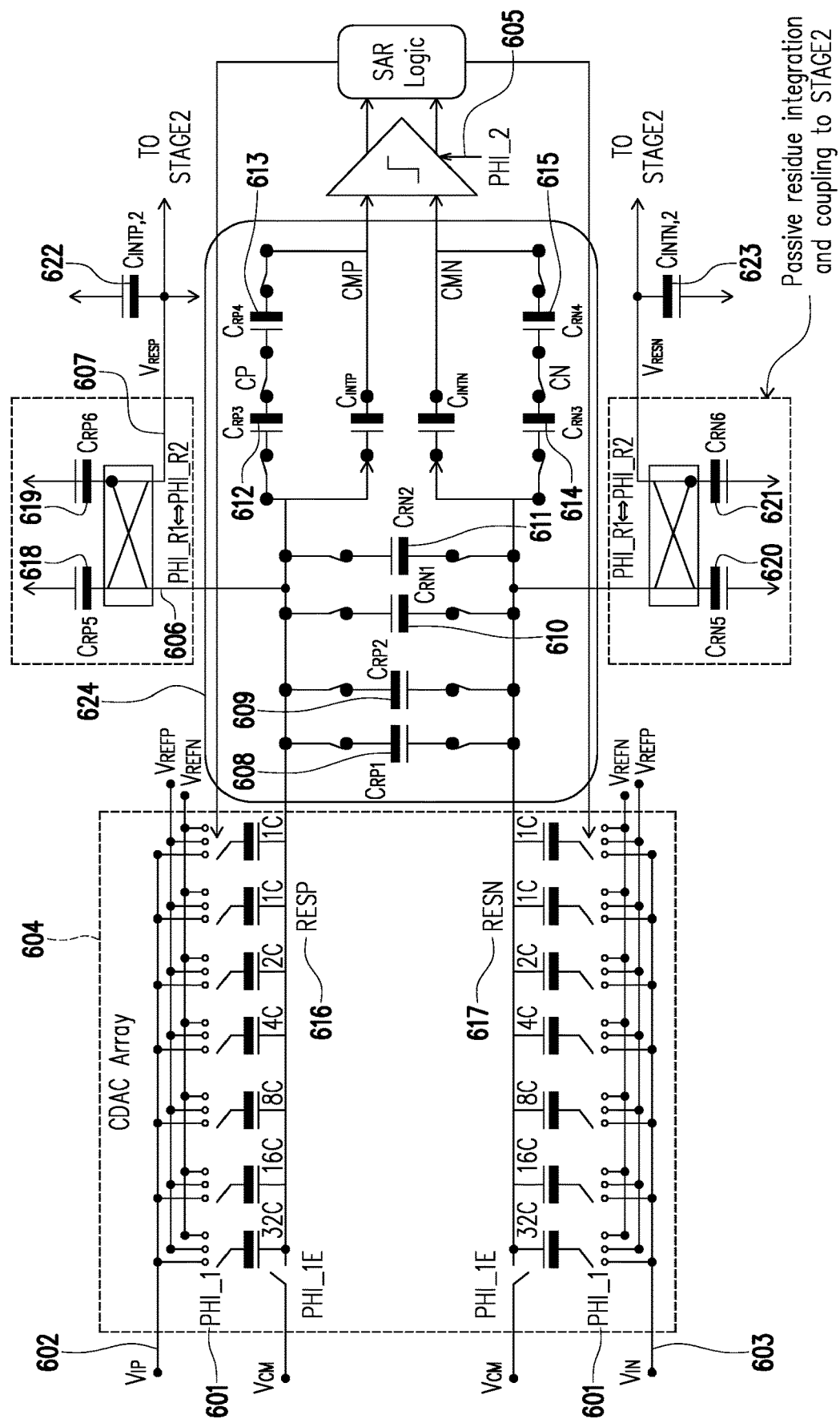
FIG. 6 is a detailed implementation of the first-stage quantizer, in accordance with some embodiments.

FIG. 6 is a detailed embodiment of the first-stage quantizer 102, in accordance with some embodiments. Differential input signals VIP 602 and VIN 603 represent positive and negative components of the differential analog input signal 101. During a first phase, first-phase signal PHI_1 601 is active and differential input signals VIP 602 and VIN 603 are received at the switched capacitors within the capacitive digital-to-analog converter array (CDAC array 604). During a second phase, second-phase signal PHI_2 605 is active and SAR technology within the first-stage quantizer 102 is used to convert sampled analog signals within the first-stage quantizer 102 to digital bits to generate the first-stage digital output signal 107. When first-phase residual signal PHI_R1 606 is at logic high (i.e., "active", or "1"), capacitors CRP1 608, CRP2 609, CRN1 610, and CRN2 611 are coupled across positive residual node RESP 616 and negative residual node RESN 617. These positive and negative residual nodes (616, 617) represent positive and negative components of the differential residual signal $V_{RES}$ 109. These capacitors are used to acquire the residue of the first-stage quantizer 102 at the end of the conversion cycle (e.g., the end of the second phase). Based on the architecture of the first-stage quantizer 102 in the example embodiment of FIG. 6, first-phase residual signal PHI_R1 606 and second-phase residual signal PHI_R2 607 will not simultaneously be active. Thus, when first-phase residual signal PHI_R1 606 is active, second-phase residual signal PHI_R2 607 will be inactive. When second-phase residual signal PHI_R2 607 is inactive, capacitors CRP3 612, CRP4 613, CRN3 614 and CRN4 615 are coupled as depicted in FIG. 6. These capacitors are used to integrate the residue from a previous conversion cycle and to generate the residual signal VRES 109. Capacitors CRP1 608, CRP2 609, CRN1 610, CRN2 611, CRP3 612, CRP4 613, CRN3 614 and CRN4 615 collectively form capacitor array 624, and may be arranged in differing configurations that are within the spirit and scope of the present disclosure, as illustrated below with respect to the discussion of FIGS. 7a and 7b.

Figure 7A:
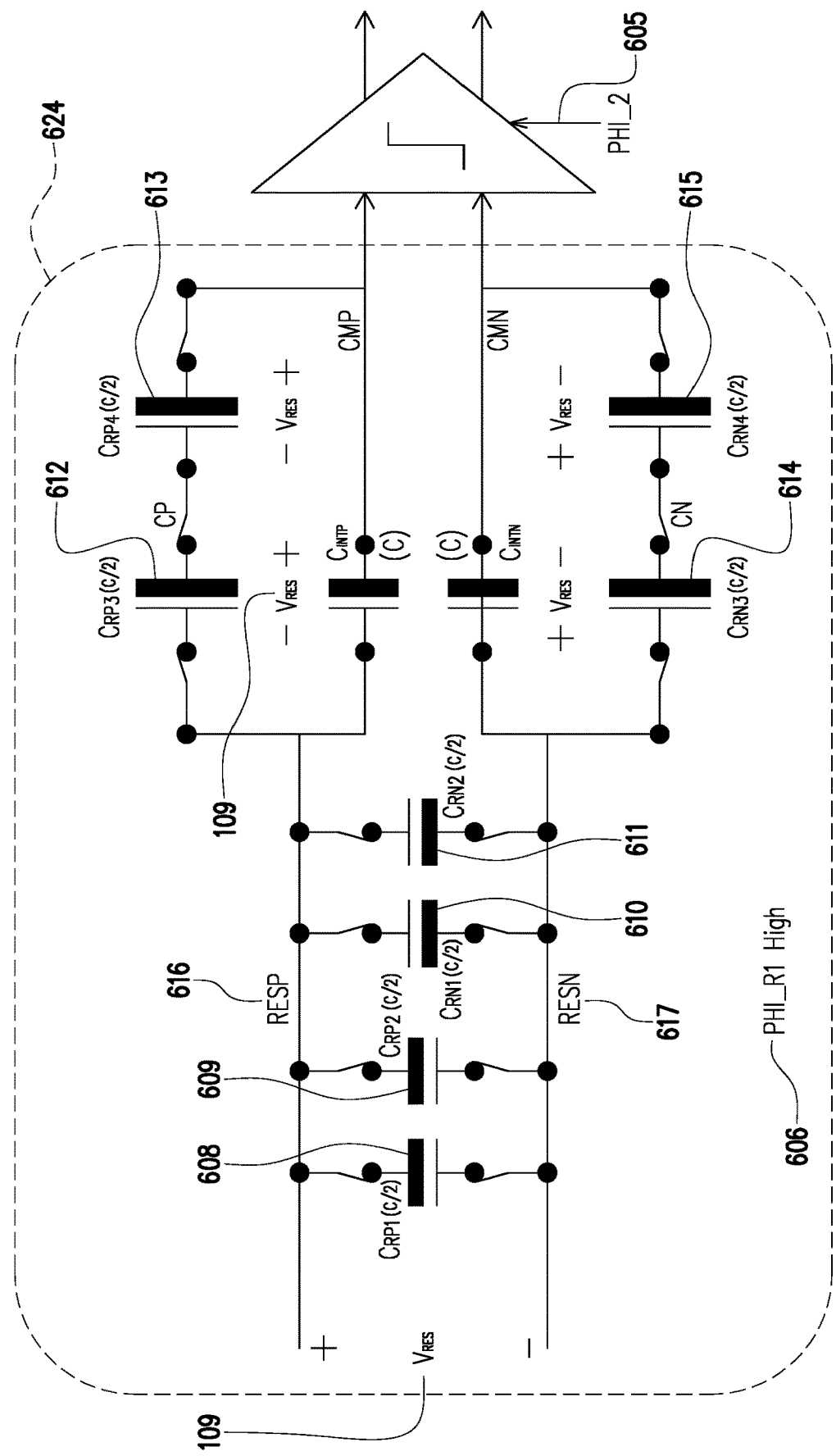
FIG. 7a is a diagram of a capacitor array shown in an operation in which the first-phase residual signal is active, in accordance with some embodiments.
Figure 7B:
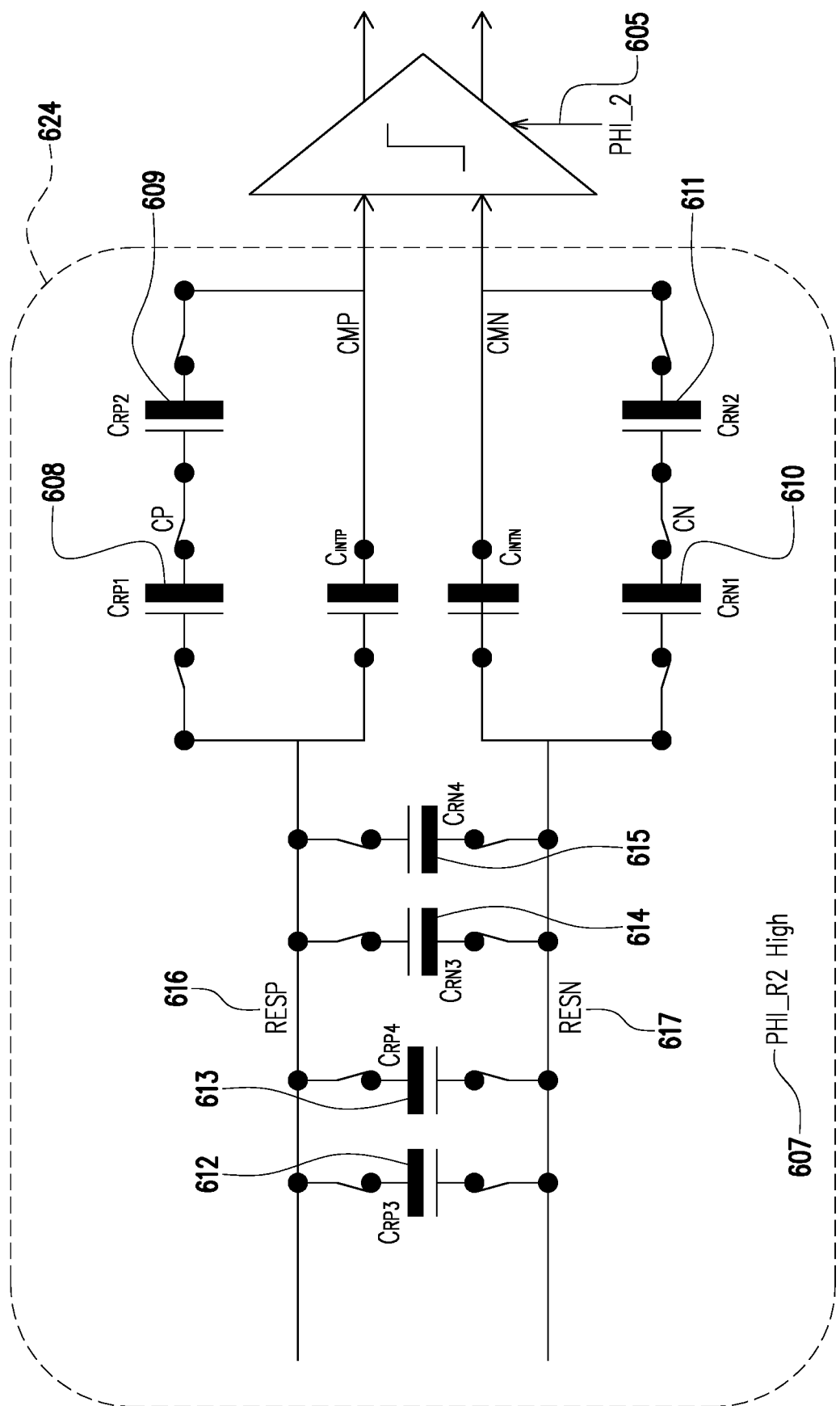
FIG. 7b is a diagram of a capacitor array shown in an operation in which the second-phase residual signal is active, in accordance with some embodiments.

FIG. 7a is a diagram of the capacitor array 624 shown in an operation when first-phase residual signal PHI_R1 606 is active, in accordance with some embodiments. FIGS. 7a and 7b can be understood when analyzed in conjunction with FIG. 6. As discussed above, when first-phase residual signal PHI_R1 606 is active, second-phase residual signal PHI_R2 607 is necessarily inactive. As shown in FIG. 7a, when first-phase residual signal PHI_R1 606 is active, capacitors CRP1 608, CRP2 609, CRN1 610, and CRN2 611 are connected in parallel and are configured to acquire the residue in the present conversion cycle. At the same time, capacitors CRP3 612 and CRP4 613, however, are coupled to a positive terminal RESP 616 of the residual voltage 109 (i.e., the positive residual node). As demonstrated in FIG.

7a, the residual voltage 109 of the previous conversion cycle is generated across capacitors CRP3 612 and CRP4 613. Capacitors CRP3 612 and CRP4 613 in conjunction with capacitor CINTP are then used to passively integrate the residue from the previous conversion cycle at the positive terminal CMP. In contrast, capacitors CRN3 614 and CRN4 615 are coupled to negative residual node RESN 617, which is a negative terminal of residual voltage VRES 109. The residual voltage of the previous conversion cycle is also generated across capacitors CRN3 614 and CRN4 615, as depicted in FIG. 7a. Capacitors CRN3 614 and CRN4 615 in conjunction with capacitor CINTN are then used to passively integrate the residue from the previous conversion cycle at the negative terminal CMN.

When first-phase residual signal PHI_R1 606 is active and second-phase residual signal PHI_R2 607 is inactive, capacitor $C_{RP5}$ 618 is coupled to positive residual node RESP 616 and capacitor $C_{RP6}$ 619 is connected to capacitor $C_{INTP,2}$ 622 for coupling to the second-stage quantizer 104. These capacitors $C_{RP5}$, $C_{RP6}$ are part of passive error extraction filter 105 and represent the positive component of the differential residual signal 109. They also assist in coupling the first-stage quantizer 102 to the second-stage quantizer 104. Also when first-phase residual signal PHI_R1 606 is active and second-phase residual signal PHI_R2 607 is inactive, capacitor $C_{RN5}$ 620 is coupled to negative residual node RESN 617 and capacitor $C_{RN6}$ 621 is connected to capacitor $C_{INTN,2}$ 623 for coupling to the second-stage quantizer 104. These capacitors $C_{RP5}$, $C_{RP6}$ form part of the passive error extraction filter 105. They determine the negative component of the differential residual signal $V_{RES}$ 109 and assist in performing the passive error extraction and coupling to the second-stage quantizer 104.

When second-phase residual signal PHI_R2 607 is active and first-phase residual signal PHI_R1 606 is inactive, capacitor $C_{RP5}$ 618 is connected to capacitor $C_{INTP,2}$ 622 and capacitor $C_{RP6}$ 619 is coupled to positive residual node RESP 616. Also when second-phase residual signal PHI_R2 607 is active and first-phase residual signal PHI_R1 606 is inactive, capacitor $C_{RN5}$ 620 is connected to capacitor $C_{INTN,2}$ 623 and capacitor $C_{RN6}$ 621 is connected to negative residual node RESN 617. Compared with the description describing operation in which first-phase residual signal PHI_R1 606 is active and second-phase residual signal PHI_R2 is inactive, different capacitors are coupled to positive residual node RESP 616 and negative residual node RESN 617.

FIG. 7b is a diagram of the capacitor array 624 shown in an operation in which second-phase residual signal PHI_R2 607 is active, in accordance with some embodiments. As discussed above, when second-phase residual signal PHI_R2 607 is active, PHI_R1 is necessarily inactive. When second-phase residual signal PHI_R2 607 is active, capacitors $C_{RP3}$ 612, $C_{RP4}$ 613, $C_{RN3}$ 614, and $C_{RN4}$ 615 are connected in parallel and are configured to acquire the residue from the present conversion cycle. As also shown in FIG. 7b, capacitors $C_{RP1}$ 608 and $C_{RP2}$ 609 are coupled to positive residual node RESP 616 and are connected in series with one another. Simultaneously, capacitors $C_{RN1}$ 610 and $C_{RN2}$ 611 are coupled to negative residual node RESN 617 and are also connected in series with each other. The residual voltage $V_{RES}$ 109 from a previous conversion cycle is generated across each of capacitors $C_{RP1}$ 608, $C_{RP2}$ 609, $C_{RN1}$ 610, and $C_{RN2}$ 611.

Figure 8:
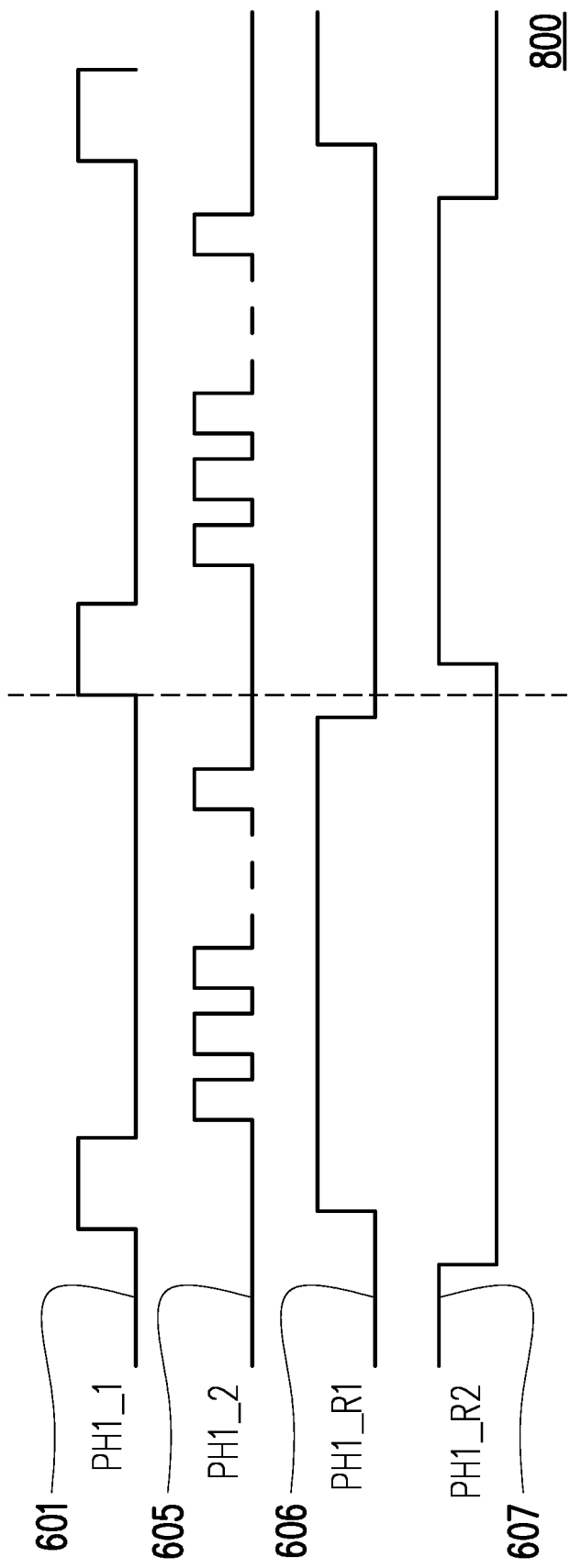
FIG. 8 is a clock diagram of the operation of signals within the detailed implementation of the first-stage quantizer, in accordance with some embodiments.

FIG. 8 is a clock diagram of the operation of signals within the detailed implementation of the first-stage quantizer 102, in accordance with some embodiments. As shown in FIG. 8 and as discussed above, the architecture of the first-stage quantizer 102 is designed such that first-phase residual signal PHI_R1 606 and second-phase residual signal PHI_R2 607 are not simultaneously active. As discussed above, when first-phase signal PHI_1 601 is active, differential input signals VIP 602 and VIN 603 are received at switched capacitors within the CDAC array 604. In the example embodiment shown in FIG. 8, first-phase signal PHI_1 601 is a periodic signal. In other embodiments, first-phase signal PHI_1 601 may not have a defined period or may have a different form than depicted in FIG. 8. Also shown in FIG. 8 is second-phase signal PHI_2 605. As discussed above, when second-phase signal PHI_2 605 is active, SAR technology within the first-stage quantizer 102 is used to convert the sampled analog signals within the first-stage quantizer 102 to digital bits to generate the first-stage digital output signal 107. Second-phase signal PHI_2 605 may be less periodic and consistent than first-phase signal PHI_1 601 in some embodiments of the present disclosure.

Figure 9:
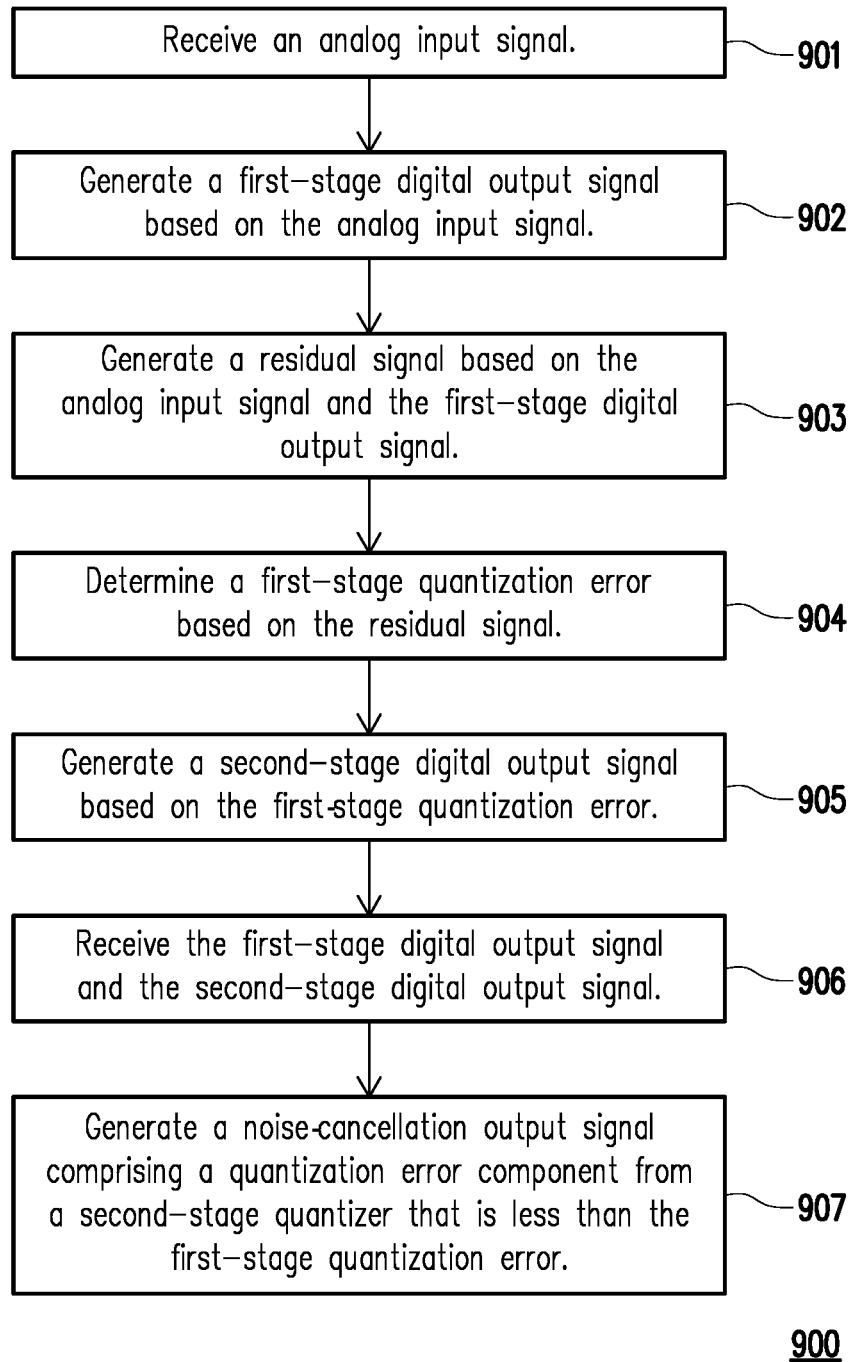
FIG. 9 shows a method of reducing a quantization error of an analog-to-digital converter, in accordance with some embodiments.

FIG. 9 shows a method 900 of reducing a quantization error of an analog-to-digital converter, in accordance with some embodiments. The method 900 of FIG. 9 can be understood when read in conjunction with FIG. 1. In embodiments of the present disclosure, the method 900 includes a first step 901 of receiving an analog input signal. This step 901 is illustrated by the arrow in FIG. 1 originating from X(z) and terminating at the first stage quantizer 102. A second step 902 is to generate a first-stage digital output signal based on the analog input signal. This step 902 is accomplished by the first stage quantizer 102 and is illustrated by the arrow 107 originating from the first-stage quantizer 102 and terminating at the noise cancellation filter 112. A third step 903 is to generate a residual signal based on the analog input signal and the first-stage digital output signal. The residual signal 109 originates from the first-stage quantizer 102 and is received at the passive error extraction filter 105, as shown in FIG. 1. A fourth step 904 is to determine a first-stage quantization error based on the residual signal. The first-stage quantization error 110 is determined by the passive error extraction filter 105 in the example embodiment shown in FIG. 1. A fifth step 905 is to generate a second-stage digital output signal based on the first-stage quantization error. The second-stage digital output signal 108 originates from the second-stage quantizer 104 and is shown by the arrow 108 from the second-stage quantizer 104 to the noise cancellation filter 103. A sixth step 906 is to receive the first-stage digital output signal and the second-stage digital output signal. The first-stage digital output signal 107 and the second-stage digital output signal 108 are received by the noise-cancellation filter 103. A seventh step 907 is to generate a noise-cancellation output signal comprising a quantization error component from a second-stage quantizer that is less than the first-stage quantization error. The noise-cancellation output signal 112 is illustrated by the arrow 112 originating from the noise-cancellation filter 103. Equation 6 and the accompanying description illustrate the quantization error component. In the example embodiment represented by equation 6, the first-stage quantization error 217 is absent from the noise cancellation output signal 112. In some embodiments of the present disclosure, the first-stage quantization error 217 may not be completely absent from the noise cancellation output signal 112 but may be reduced.

Figure 10:
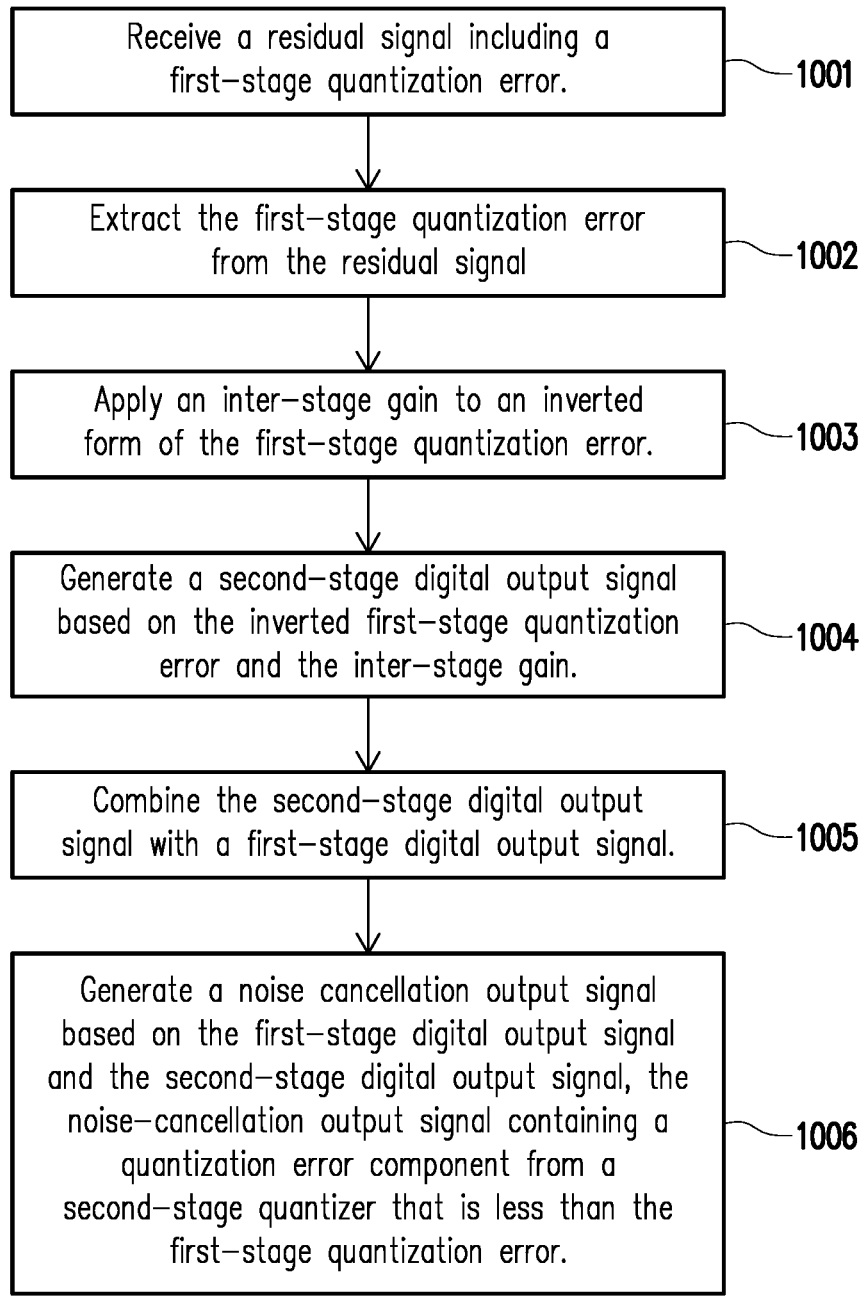
FIG. 10 shows a method of reducing a quantization error, in accordance with some embodiments.

FIG. 10 shows a method 1000 of reducing a quantization error, in accordance with some embodiments. The method 1000 of FIG. 10 can be understood when read in conjunction with FIG. 1. A first step 1001 in the method 1000 of FIG. 10 is to receive a residual signal including a first-stage quantization error. The residual signal 109 originates from the first-stage quantizer 102 and is received at the passive error extraction filter 105, as shown in FIG. 1. A second step 1002 is to extract the first-stage quantization error from the residual signal. The first-stage quantization error 110 is extracted by the passive error extraction filter 105, as shown in FIG. 1. A third step 1003 is to apply an inter-stage gain to an inverted form of the first-stage quantization error. The inter-stage gain GA 106 is illustrated in the example embodiment depicted in FIG. 1. A fourth step 1004 is to generate a second-stage digital output signal based on the inverted first-stage quantization error and the inter-stage gain. The second-stage digital output signal 108 is illustrated by the arrow in FIG. 1 originating from the second-stage quantizer 104 and terminating at the noise-cancellation filter 103. A fifth step 1005 is to combine the second-stage digital output signal with a first-stage digital output signal. In example embodiments of the present disclosure, the noise-cancellation filter 103 is utilized to combine the second-stage digital output signal 108 with the first-stage digital output signal 107. A sixth step 1006 is to generate a noise-cancellation output signal based on the first-stage digital output signal and the second-stage digital output signal, the noise-cancellation output signal containing a quantization error component from a second-stage quantizer that is less than the first-stage quantization error. The noise-cancellation output signal 112 is illustrated by the arrow 112 originating from the noise-cancellation filter 103. Equation 6 and the accompanying description illustrate the quantization error component. In the example embodiment represented by equation 6, the first-stage quantization error 217 is absent from the noise cancellation output signal 112. In some embodiments of the present disclosure, the first-stage quantization error 217 may not be completely absent from the noise cancellation output signal 112 but may be reduced.

Embodiments of the present disclosure are directed to an analog-to-digital converter. The analog-to-digital converter includes a first-stage quantizer configured to receive an analog input signal and to generate a first-stage digital output signal based on the analog input signal. The first-stage quantizer is further configured to generate a residual signal based on the first-stage digital output signal and the analog input signal. The analog-to-digital converter is further configured to determine a first-stage quantization error based on the residual signal and to generate a second-stage input signal based on the first-stage quantization error.

The analog-to-digital converter of the present disclosure also includes a second-stage quantizer that is coupled to the first-stage quantizer. The second-stage quantizer is configured to receive the second-stage input signal, to digitize the first-stage quantization error, and to generate a second-stage digital output signal based on the digitized first-stage quantization error. The analog-to-digital converter also includes a noise-cancellation filter that is coupled to the first-stage quantizer and the second-stage quantizer. In example embodiments, the noise-cancellation filter is configured to receive the first-stage digital output signal and the second-stage digital output signal and to generate a noise-cancellation output signal based on the first-stage digital output signal and the second-stage digital output signal that comprises a quantization error component that is less than the first-stage quantization error.

In some embodiments of the present disclosure, the quantization error component of the noise-cancellation filter is also less than a second-stage quantization error. The second-stage digital output signal may comprise a first component proportional to an inverted form of the first-stage quantization error. In some embodiments, the first component of the second-stage digital output signal further comprises a second-stage signal transfer function. This second-stage signal transfer function may be a constant. The second-stage digital output signal may further comprise a second component including a second-stage quantization error.

In some embodiments, the first-stage quantizer of the analog-to-digital converter further comprises a passive integrator configured to receive the residual signal, to apply a clock period delay to the residual signal, and to generate a passive integrator output signal. The passive integrator may comprise a plurality of switches and a plurality of capacitors. The noise cancellation filter of the analog-to-digital converter may be further configured to apply a noise-cancellation noise transfer function to the second-stage digital output signal. The first-stage quantizer may be further configured to apply a first-stage noise transfer function to the first-stage quantization error. In some embodiments, the noise-cancellation noise transfer function and the first-stage noise transfer function are the same functions.

The foregoing also discloses a method of reducing a quantization error of an analog-to-digital converter. In some embodiments, this method includes steps of receiving an analog input signal; generating a first-stage digital output signal based on the analog input signal; generating a residual signal based on the analog input signal and the first-stage digital output signal; determining a first-stage quantization error based on the residual signal; generating a second-stage digital output signal based on the first-stage quantization error; receiving the first-stage digital output signal and the second-stage digital output signal; and generating a noise-cancellation output signal comprising a quantization error component from a second-stage quantizer that is less than the first-stage quantization error.

The method may further include applying a first-stage noise transfer function to the first-stage quantization error. The method may further include applying a second-stage noise transfer function to a second-stage quantization error. In some embodiments, the method includes a step of applying a noise-cancellation noise transfer function to the second-stage digital output signal. The noise-cancellation noise transfer function and the first-stage noise transfer function may be the same functions. The second-stage digital output signal may comprise a first component proportional to an inverted first-stage quantization error. The method may further include the step of receiving the residual signal, applying a clock period delay to the residual signal, and generating a passive integrator output signal.

The foregoing also discloses a method of reducing a quantization error. In some embodiments, the method includes receiving a residual signal including a first-stage quantization error; extracting the first-stage quantization error from the residual signal; applying an inter-stage gain to an inverted form of the first-stage quantization error; generating a second-stage digital output signal based on the inverted first-stage quantization error and the inter-stage gain; combining the second-stage digital output signal with a first-stage digital output signal; and generating a noise cancellation output signal based on the first-stage digital output signal and the second-stage digital output signal, with the noise cancellation output signal containing a quantization error component from a second-stage quantizer that is less than the first-stage quantization error. In some embodiments, this method further includes the step of applying a noise cancellation noise transfer function to the second-stage digital output signal.

It will be appreciated by those skilled in the art that changes could be made to the embodiments described above without departing from the broad inventive concept thereof. It is understood, therefore, that the invention disclosed herein is not limited to the particular embodiments disclosed, and is intended to cover modifications within the spirit and scope of the present invention.

What is claimed is:

1. An analog-to-digital converter comprising:
a first-stage quantizer configured to receive an analog input signal and to generate a first-stage digital output signal based on the analog input signal and a residual signal based on the first-stage digital output signal and the analog input signal, the first-stage quantizer comprising a passive integrator configured to receive the residual signal, to apply a clock period delay to the residual signal, and to generate a passive integrator output signal, the analog-to-digital converter configured to determine a first-stage quantization error based on the residual signal and to generate a second-stage input signal based on the first-stage quantization error;
a second-stage quantizer coupled to the first-stage quantizer, the second-stage quantizer configured to receive the second-stage input signal, to digitize the first-stage quantization error, and to generate a second-stage digital output signal based on the digitized first-stage quantization error; and
a noise-cancellation filter coupled to the first-stage quantizer and the second-stage quantizer, the noise-cancellation filter configured to receive the first-stage digital output signal and the second-stage digital output signal and to generate a noise-cancellation output signal based on the first-stage digital output signal and the second-stage digital output signal, the noise-cancellation output signal comprising a quantization error component that is less than the first-stage quantization error.

2. The analog-to-digital converter of claim 1, wherein the quantization error component of the noise-cancellation filter is less than a second-stage quantization error.

3. The analog-to-digital converter of claim 1, wherein the second-stage digital output signal comprises a first component proportional to a negative value of the first-stage quantization error.

4. The analog-to-digital converter of claim 3, wherein the first component of the second-stage digital output signal further comprises a second-stage signal transfer function.

5. The analog-to-digital converter of claim 4, wherein the second-stage signal transfer function is a constant.

6. The analog-to-digital converter of claim 3, wherein the second-stage digital output signal further comprises a second component including a second-stage quantization error.

7. The analog-to-digital converter of claim 1, wherein the passive integrator comprises a plurality of switches and a plurality of capacitors.

8. The analog-to-digital converter of claim 1, wherein the noise-cancellation filter is further configured to apply a noise-cancellation noise transfer function to the second-stage digital output signal.

9. The analog-to-digital converter of claim 8, wherein the first-stage quantizer is further configured to apply a first-stage noise transfer function to the first-stage quantization error.

10. The analog-to-digital converter of claim 9, wherein the noise-cancellation noise transfer function and the first-stage noise transfer function are the same functions.

11. The analog-to-digital converter of claim 1, wherein the passive integrator includes a passive integrator gain factor and a clock period delay component configured to be applied to the residual signal.

12. A method of reducing a quantization error of an analog-to-digital converter comprising:
receiving an analog input signal;
generating a first-stage digital output signal based on the analog input signal;
generating a residual signal based on the analog input signal and the first-stage digital output signal;
receiving the residual signal, applying a clock period delay to the residual signal, and generating a passive integrator output signal;
determining a first-stage quantization error based on the residual signal;
generating a second-stage digital output signal based on the first-stage quantization error;
receiving the first-stage digital output signal and the second-stage digital output signal; and
generating a noise-cancellation output signal comprising a quantization error component from a second-stage quantizer that is less than the first-stage quantization error.

13. The method of claim 12, further comprising applying a first-stage noise transfer function to the first-stage quantization error.

14. The method of claim 13, further comprising applying a second-stage noise transfer function to a second-stage quantization error.

15. The method of claim 14, further comprising applying a noise-cancellation noise transfer function to the second-stage digital output signal.

16. The method of claim 15, wherein the noise-cancellation noise transfer function and the first-stage noise transfer function are the same functions.

17. The method of claim 12, wherein the second-stage digital output signal comprises a first component proportional to an inverted first-stage quantization error.

18. The method of claim 12, further comprising applying a passive integrator gain factor and a clock period delay component to the residual signal.

19. A method of reducing a quantization error comprising:
receiving a residual signal including a first-stage quantization error;
applying a clock period delay to the residual signal and generating a passive integrator output signal;
extracting the first-stage quantization error from the residual signal;
applying an inter-stage gain to an inverted form of the first-stage quantization error;
generating a second-stage digital output signal based on the inverted first-stage quantization error and the inter-stage gain;
combining the second-stage digital output signal with a first-stage digital output signal; and
generating a noise cancellation output signal based on the first-stage digital output signal and the second-stage digital output signal, the noise cancellation output signal containing a quantization error component from a second-stage quantizer that is less than the first-stage quantization error.

20. The method of claim 19, further comprising applying a noise cancellation noise transfer function to the second-stage digital output signal.

* * * * *